United States Patent
Iseki et al.

(10) Patent No.: US 10,283,785 B2
(45) Date of Patent: May 7, 2019

(54) AMORPHOUS CARBON FILM, PROCESS FOR FORMING AMORPHOUS CARBON FILM, ELECTRICALLY CONDUCTIVE MEMBER AND FUEL CELL BIPOLAR PLATE HAVING AMORPHOUS CARBON FILM

(71) Applicants: KABUSHIKI KAISHA TOYOTA CHUO KENKYUSHO, Nagakute-shi (JP); TOYOTA JIDOSHA KABUSHIKI KAISHA, Toyota-shi (JP)

(72) Inventors: Takashi Iseki, Nagakute (JP); Kazuyuki Nakanishi, Seto (JP); Yasuhiro Ozawa, Nagakute (JP); Naoki Ueda, Toyota (JP); Masafumi Koizumi, Nagoya (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 647 days.

(21) Appl. No.: 14/374,725

(22) PCT Filed: Jan. 25, 2013

(86) PCT No.: PCT/JP2013/000369
§ 371 (c)(1),
(2) Date: Jul. 25, 2014

(87) PCT Pub. No.: WO2013/114836
PCT Pub. Date: Aug. 8, 2013

(65) Prior Publication Data
US 2014/0356764 A1     Dec. 4, 2014

(30) Foreign Application Priority Data

Jan. 30, 2012 (JP) .................. 2012-016256

(51) Int. Cl.
*H01M 8/00* (2016.01)
*H01M 8/0228* (2016.01)
(Continued)

(52) U.S. Cl.
CPC ........... *H01M 8/0228* (2013.01); *C01B 32/05* (2017.08); *C23C 16/26* (2013.01);
(Continued)

(58) Field of Classification Search
CPC ....... H01M 8/0228; C01B 31/02; C23C 16/26
(Continued)

(56) References Cited

U.S. PATENT DOCUMENTS

2010/0028749 A1* 2/2010 Dadheech ........... H01M 8/0206
429/514

FOREIGN PATENT DOCUMENTS

JP    2000-067881 A   3/2000
JP    2002-038268 A   2/2002
(Continued)

OTHER PUBLICATIONS

Machine translation of JP 2008-004540, obtained Jul. 29, 2016.*

*Primary Examiner* — Nicholas P D'Aniello
*Assistant Examiner* — Abibatu O Ojo-Amoo
(74) *Attorney, Agent, or Firm* — Hunton Andrews Kurth LLP (57) ABSTRACT

An amorphous carbon film contains carbon as a main component, not more than 30 at. % of hydrogen, not more than 20 at. % of nitrogen and not more than 3 at. % of oxygen (all excluding 0 at. %), and when the total amount of the carbon is taken as 100 at. %, the amount of carbon having an $sp^2$ hybrid orbital is not less than 70 at. % and less than 100 at. %. Nitrogen and oxygen are concentrated on a surface side of the film and when detected from a surface layer by X-ray photoelectron spectroscopy, oxygen content
(Continued)

ratio is not less than 4 at. % and not more than 15 at. % and nitrogen content ratio is not less than 10 at. % and not more than 30 at. %.

15 Claims, 3 Drawing Sheets

(51) Int. Cl.
- *C23C 16/26* (2006.01)
- *C23C 16/50* (2006.01)
- *H01M 8/0206* (2016.01)
- *H01M 8/0213* (2016.01)
- *C23C 16/455* (2006.01)
- *C01B 32/05* (2017.01)
- *H01M 8/1018* (2016.01)

(52) U.S. Cl.
CPC ........ *C23C 16/45523* (2013.01); *C23C 16/50* (2013.01); *H01M 8/0206* (2013.01); *H01M 8/0213* (2013.01); *H01M 2008/1095* (2013.01); *Y02P 70/56* (2015.11)

(58) Field of Classification Search
USPC ......................................................... 429/518
See application file for complete search history.

(56) References Cited

FOREIGN PATENT DOCUMENTS

| | | |
|---|---|---|
| JP | 2002-327271 A | 11/2002 |
| JP | 2004-284915 A | 10/2004 |
| JP | 2005-093172 A | 4/2005 |
| JP | 2008-004540 A | 1/2008 |
| JP | 2011-108547 A | 6/2011 |

\* cited by examiner

AMORPHOUS CARBON FILM, PROCESS FOR FORMING AMORPHOUS CARBON FILM, ELECTRICALLY CONDUCTIVE MEMBER AND FUEL CELL BIPOLAR PLATE HAVING AMORPHOUS CARBON FILM

CROSS-REFERENCE TO RELATED APPLICATIONS

This is a national phase application based on the PCT International Patent Application No. PCT/JP2013/000369 filed Jan. 25, 2013, claiming priority to Japanese patent application No. 2012-016256 filed Jan. 30, 2012, the entire contents of both of which are incorporated herein by reference.

TECHNICAL FIELD

The present invention relates to an amorphous carbon film containing carbon as a main component and exhibiting electric conductivity, a process for forming the same, and an electrically conductive member having an amorphous carbon film as typified by a bipolar plate for a fuel cell.

BACKGROUND ART

Owing to its almost unlimited resources and harmlessness, carbon is an excellent material in view of resources and environmental problems. Carbon materials have diverse forms of interatomic bonding, and a variety of crystal structures are known, such as diamond, diamond-like carbon, graphite, fullerene and carbon nanotubes. Above all, diamond-like carbon having an amorphous structure (amorphous carbon) is expected to be applied in each industrial field, because of its high mechanical strength and good chemical stability.

Figure 5:
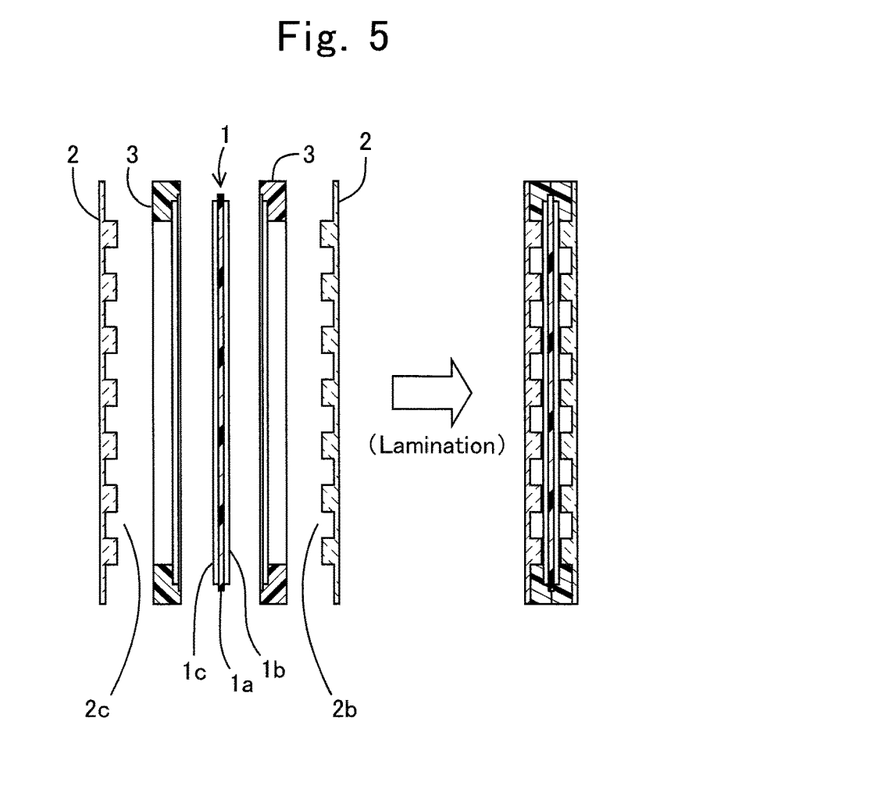
FIG. 5 is a cross-sectional view schematically illustrating an example of a single cell of a polymer electrolyte fuel cell.

However, general amorphous carbon films have electric resistance in a range of semiconductors to insulators. In order to further widen the use of amorphous carbon, it has been requested to impart electric conductivity to amorphous carbon. One of the use applications of the amorphous carbon is a bipolar plate for a fuel cell. An example of a single cell of a polymer electrolyte fuel cell is schematically shown in FIG. 5. The left diagram of FIG. 5 shows arrangement of its respective constituent elements before laminated and the right diagram of FIG. 5 shows a laminated state of these elements. A single cell 1 is constituted by an electrolyte membrane 1a, and a pair of electrodes (an air electrode 1b and a fuel electrode 1c) sandwiching the electrolyte membrane 1a from both sides. Bipolar plates 2 have channel-formed surfaces 2b, 2c on which a plurality of channels are formed. The bipolar plates 2 are housed in resin bipolar plate frames 3 and laminated so that the air electrode 1b and the channel-formed surface 2b face each other and the fuel electrode 1c and the channel-formed surface 2c face each other, respectively. Thus, gas flow passages sectioned by electrode surfaces and the channels are formed between the electrodes and the bipolar plates, and fuel gas and oxygen gas, which are reaction gases of the fuel cell, are efficiently supplied to the electrode surfaces.

In the fuel cell, the fuel gas and the oxygen gas need to be separately supplied to the entire electrode surfaces without mixed with each other. Therefore, the bipolar plates need to be gas tight. Furthermore, the bipolar plates need to collect electrons generated by reaction and have good electric conductivity in order to serve as electric connectors for connecting adjoining single cells when a plurality of single cells are stacked. Moreover, because electrolyte membrane surfaces are strongly acidic, the bipolar plates are demanded to have corrosion resistance.

Therefore, as a bipolar plate material, it is common to use graphite plates. However, since the graphite plates break easily, the graphite plates have a problem with workability in producing bipolar plates by forming a plurality of gas passages, making surfaces flat and so on. On the other hand, because metallic materials have good workability as well as good electric conductivity and especially titanium and stainless steel have good corrosion resistance, the metallic materials can be used as bipolar plate materials. However, since metallic materials having good corrosion resistance are easily passivated, the metallic materials have a problem of increasing internal resistance of a fuel cell and causing a voltage drop. Therefore, a bipolar plate formed by coating a surface of a metal substrate with an electrically conductive amorphous carbon film is attracting attention.

Examples of a process for imparting electric conductivity to amorphous carbon include a process for adding a metal to amorphous carbon (See Japanese Unexamined Patent Publication Nos. 2002-038268 and 2004-284915). However, the added metal may become a cause of corrosion or, when used in contact with another metal, may become a cause of adhesion, so inherent chemical stability of amorphous carbon can be damaged.

Therefore, Japanese Unexamined Patent Publication No. 2008-004540 discloses an amorphous carbon film having good electric conductivity and corrosion resistance, obtained based on a finding that electric conductivity can be imparted to an amorphous carbon film by increasing ratio of a structure comprising carbon having an $sp^2$ hybrid orbital ($Csp^2$) by controlling the content of hydrogen and carbon having an $sp^2$ hybrid orbital ($Csp^2$) in amorphous carbon. Specifically, the film is an amorphous carbon film containing carbon as a main component wherein the film contains more than 0 at. % and not more than 30 at. % of hydrogen and if necessary, not more than 20 at. % of nitrogen, and when the total amount of the carbon is taken as 100 at. %, the amount of $Csp^2$ is not less than 70 at. % and less than 100 at. %. In this amorphous carbon film, delocalization of π electrons is promoted due to a large ratio of $Csp^2$ in the entire carbon and molecular termination by C—H bonds (n bonds) is suppressed due to a decrease in hydrogen content. As a result, this amorphous carbon film exhibits a high electric conductivity. Besides, this amorphous carbon film is amorphous and does not have such electric anisotropy as exhibited by single crystal graphite.

Moreover, one of the functions requested to a bipolar plate of a fuel cell is a function to rapidly discharge water generated by a battery reaction at an electrode from gas passages in order to ensure passages of fuel gas and oxygen gas. Water remaining in the gas passages causes a decrease in power generation performance of the fuel cell. Therefore, an improvement in wettability of surfaces of the gas passages is important to performance of the fuel cell. For example, Japanese Unexamined Patent Publication No. 2011-108547 mentions that an amorphous carbon film is designed to contain 20 at. % of nitrogen in order to improve hydrophilicity of the amorphous carbon film.

CITATION LIST

Patent Literature

[PTL 1] Japanese Unexamined Patent Publication No. 2002-038268

[PTL 2] Japanese Unexamined Patent Publication No. 2004-284915

[PTL 3] Japanese Unexamined Patent Publication NO. 2008-004540

[PTL 4] Japanese Unexamined Patent Publication No. 2011-108547

SUMMARY OF INVENTION

Problems to be Solved by Invention

The amorphous carbon film having good electric conductivity and corrosion resistance recited in Japanese Unexamined Patent Publication No. 2008-004540 is formed on a surface of a substrate by plasma CVD at a practical rate. In plasma CVD, reaction gas as a raw material is introduced into a reaction vessel in which a substrate is placed and an electric charge is caused so as to generate plasma from the reaction gas and deposit a decomposed material and the like on a surface of the substrate. A further increase in film forming rate is sought for in view of productivity enhancement for mass production. In order to increase film forming rate in plasma CVD, it is easy to adopt a technique of increasing flow rate of reaction gas. However, it has been turned out that an amorphous carbon film formed by increasing the flow rate of the reaction gas has a higher oxygen content in spite of only a change in the flow rate. This is believed to be because the increase in the reaction gas causes an increase in the amount of undecomposed components of the reaction gas and an outermost surface of the amorphous carbon becomes active and easily oxidizable in the air. A surface of a film of amorphous carbon terminated with oxygen has a high contact resistance, which causes a decrease in electric conductivity.

Moreover, composition of a surface layer of the amorphous carbon film affects wettability of a film surface. An electrically conductive member exhibiting suitable wettability (hydrophilicity) for a bipolar plate may be able to be obtained by optimizing composition of the surface layer while maintaining composition of the entire amorphous carbon film having good electric conductivity and corrosion resistance.

The present invention has been made in view of these circumstances and it is an object of the present invention to provide an amorphous carbon film having good electric conductivity and surface characteristics including hydrophilicity. It is also an object of the present invention to provide a process for forming such an amorphous carbon film, an electrically conductive member, such as a fuel cell bipolar plate, having such an amorphous carbon film.

Technical Solution

The present invention is an amorphous carbon film containing carbon as a main component, not more than 30 at. % of hydrogen, not more than 20 at. % of nitrogen and not more than 3 at. % of oxygen (all excluding 0 at. %), and when the total amount of the carbon is taken as 100 at. %, the amount of carbon having an $sp^2$ hybrid orbital being not less than 70 at. % and less than 100 at. %, which is characterized in that nitrogen and oxygen are concentrated on a surface side of the film and when detected from a surface layer by X-ray photoelectron spectroscopy, oxygen content ratio is not less than 4 at. % and not more than 15 at. % and nitrogen content ratio is not less than 10 at. % and not more than 30 at. %.

In the present description, carbon forming an $sp^2$ hybrid orbital to bond is referred to as "carbon having an $sp^2$ hybrid orbital" or "$Csp^2$". Similarly, carbon forming an $sp^3$ hybrid orbital to bond is referred to as "carbon having an $sp^3$ hybrid orbital" or "$Csp^3$".

Depending on a difference in atomic orbital in chemical bonding, there are three types of carbon atoms: carbon having an sp hybrid orbital (Csp), carbon having an $sp^2$ hybrid orbital ($Csp^2$), and carbon having an $sp^3$ hybrid orbital ($Csp^3$). For example, diamond, which is composed of $Csp^3$ only, forms a bonds only and exhibits high electric insulation due to localization of σ electrons. On the other hand, graphite is composed of $Csp^2$ only and forms c bonds and n bonds and exhibits high electric conductivity due to delocalization of π electrons.

In the amorphous carbon film of the present invention, delocalization of π electrons is promoted due to a high ratio of $Csp^2$ in entire film composition and molecular termination by C—H bonds (σ bonds) is suppressed due to a decrease in hydrogen content. As a result, the amorphous carbon film of the present invention exhibits a high electric conductivity. Moreover, the amorphous carbon film of the present invention is amorphous and does not have such electric anisotropy as exhibited by single crystal graphite.

Furthermore, the amorphous carbon film of the present invention can attain both electric conductivity and hydrophilicity by appropriately suppressing oxygen content ratio in composition of a surface layer. Although a large oxygen content of a film surface generally increases contact resistance, which results in a decrease in electric conductivity, it is assumed that presence of nitrogen suppresses the decrease in electric conductivity.

It should be noted that in the present description, oxygen and nitrogen contained in a surface layer of the amorphous carbon film were detected by XPS. XPS is an abbreviation of X-ray photoelectron spectroscopy and can analyze states of elements within several nanometers from an outermost surface of a material. Oxygen content ratio and nitrogen content ratio in the surface layer of the amorphous carbon film are values obtained by analyzing carbon, oxygen and nitrogen (hydrogen: not detectable) by an XPS instrument and calculating a ratio of each element content to a total of these three elements in terms of atomic %. Since detection depth from a surface depends on measurement conditions, in the present description, measurement conditions are to be adjusted so as to be able to measure a surface layer within 2 to 3 nm from an outermost surface. Although the method of measurement, the kind of device, and measurement conditions are not particularly limited as long as similar results are obtained, conditions described in examples mentioned later are preferred.

Moreover, the amorphous carbon film of the present invention can be formed on a surface of a substrate by plasma CVD. Particularly, a process for forming an amorphous carbon film according to the present invention is a process for forming the aforementioned amorphous carbon film of the present invention on a surface of a substrate by plasma CVD by introducing reaction gas comprising nitrogen gas and carbon-containing gas including at least one kind of gas selected from gas of a carbon cyclic compound containing carbon having an $sp^2$ hybrid orbital and gas of a nitrogen-containing heterocyclic compound containing carbon having an $sp^2$ hybrid orbital and N into a reaction vessel containing the substrate, and generating plasma, which is characterized in that:

the amorphous carbon film is formed by way of a first film forming step, and a second film forming step after the first film forming step, and the second film forming step is carried out by introducing the reaction gas into the reaction vessel in such a manner that a flow ratio of the nitrogen gas to the carbon-containing gas is greater than the flow ratio in the first film forming step.

According to the process for forming the amorphous carbon film according to the present invention, an amorphous carbon film having a ratio of $Csp^2$ in the total carbon of not less than 70 at. % and having a small hydrogen content can be formed with ease by using gas containing carbon including $Csp^2$ as a raw material. Furthermore, upon dividing a series of amorphous carbon film forming steps into two steps, and changing flow ratio of nitrogen gas to carbon-containing gas, a film can be suppressed from oxidized in the air after formed can have a surface portion having small contact resistance and a high hydrophilicity. Since film formation is carried out in an atmosphere containing a relatively large amount of nitrogen in the second film forming step, the amount of nitrogen present on a surface side of the amorphous carbon film increases. A mechanism of suppressing oxidation by an increase in nitrogen in the surface layer is believed to be as follows. Since film formation is carried out in an atmosphere having a relatively high ratio of nitrogen gas in the second film forming step when compared with in the first film forming step, organic undecomposed carbon-containing gas is suppressed from being attached to an outermost surface of an amorphous carbon film. At the same time with that, carbon radicals (C.) generated on the outermost surface of the amorphous carbon film are replaced with N and form C—N bonds. As a result, even if the outermost surface of the amorphous carbon film contacts oxygen, the outermost surface is suppressed from forming bonds with oxygen, i.e., being oxidized.

Furthermore, the amorphous carbon film of the present invention is suitable for an electrically conductive member, particularly for a bipolar plate of a fuel cell. That is to say, an electrically conductive member of the present invention is characterized in comprising a substrate and the amorphous carbon film of the present invention formed on at least part of the substrate.

Besides, a fuel cell bipolar plate of the present invention is a fuel cell bipolar plate of the present invention comprising a metal substrate and an amorphous carbon film covering at least part of a surface of the substrate to face an electrode, which is characterized in that the amorphous carbon film is the aforementioned amorphous carbon film of the present invention.

The electrically conductive member of the present invention comprises the aforementioned amorphous carbon film of the present invention. Therefore, the electrically conductive member of the present invention is suitable for members such as a fuel cell bipolar plate which is required to have good hydrophilicity as well as high electric conductivity.

Advantageous Effects of Invention

The amorphous carbon film of the present invention attains both electric conductivity and hydrophilicity and exhibits surface characteristics particularly suitable for a fuel cell bipolar plate and the like. Moreover, such an amorphous carbon film can be formed with ease by the process for forming the amorphous carbon film according to the present invention.

MODES FOR CARRYING OUT THE INVENTION

Next, the amorphous carbon film, the process for forming the amorphous carbon film, the electrically conductive member and fuel cell bipolar plate having the amorphous carbon film according to the present invention will be described in more detail by way of embodiments.

Amorphous Carbon Film

The amorphous carbon film of the present invention mainly contains carbon (C), hydrogen (H), nitrogen (N), and oxygen (O), but since N and O are concentrated on a surface side of the film, concentration distribution of N and O in a film thickness direction is not entirely uniform. Composition of the entire amorphous carbon film and composition of a surface layer of the amorphous carbon film will be separately discussed in the following description. It should be noted that content mentioned below is values when the entire amorphous carbon film is taken as 100 at. %, unless otherwise specified.

The amorphous carbon film of the present invention contains C as a main component, not more than 30 at. % of H, not more than 20 at. % of N and not more than 3 at. % of O (all excluding 0 at. %), and when the total amount of the carbon is taken as 100 at. %, the amount of carbon having an $sp^2$ hybrid orbital (the amount of $Csp^2$) is not less than 70 at. % and less than 100 at. %.

Examples of a method for determining the amount of $Csp^2$ or $Csp^3$ include Raman scattering spectroscopy, infrared spectroscopy (FT-IR) and X-ray photoelectron spectroscopy (XPS). One such example shown in public is a technique to calculate a ratio of the amount of $Csp^2$ to that of $Csp^3$ from a ratio of intensity of G band around 1580 $cm^{-1}$ to that of D band around 1350 $cm^{-1}$ "I(D)/I(G)" measured by using Raman scattering with a visible light source. Recent studies, however, have shown that sensitivity of $Csp^3$ in D band is 1/50 to 1/2 of sensitivity of $Csp^2$ ("Materials Science & Engineering R:Reports 37 (4-6) p. 129 2002"). Hence, the amount of $Csp^3$ cannot be discussed based on Raman scattering spectroscopy. Furthermore, it is general perception that FT-IR can qualitatively evaluate C—H bonds around 2900 $cm^{-1}$ but cannot quantify $Csp^2$ or $Csp^3$ ("Applied Physics Letters 60 p. 2089 1992"). Moreover, it is not impossible for XPS to calculate an assumed ratio of the amount of $Csp^2$ to $Csp^3$ by separating peaks of C=C bonds and C—C bonds from C1s binding energy. However, since a difference between these two binding energies is small and most peaks are monomodal, peak separation has to be arbitrarily carried out. In addition, area to be analyzed by XPS is limited to an outermost surface within about several nanometers in depth, from which photoelectrons can be escaped. Since the outermost surface is easily affected by dangling bonds or oxidation, the outermost surface is different in structure from an inner portion. Therefore, there is a big problem in determining structure of the entire film by determining structure of the outermost surface. In order to know an inner structure, it is possible to use a technique to obtain an XPS spectrum on the spot while sputtering argon ions. However, the inner structure is changed by ion bombardment, so a true structure cannot always be grasped by this technique.

Figure 1:
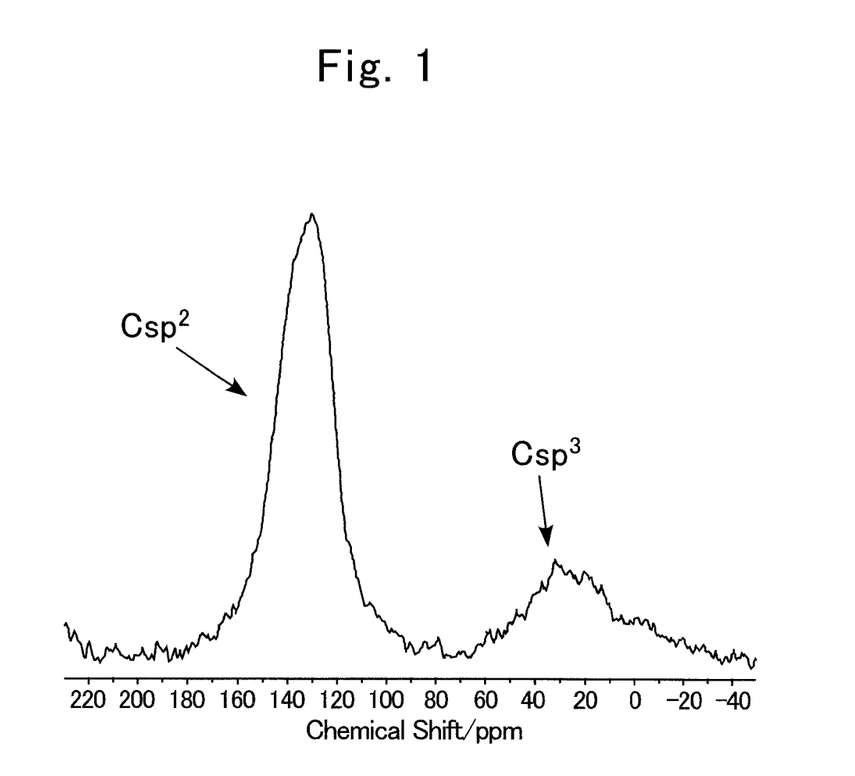
FIG. 1 is an example of a $^{13}C$ NMR spectrum of an amorphous carbon film.

As mentioned heretofore, the aforementioned methods cannot exactly determine the amount of $Csp^2$ or $Csp^3$. Therefore, employed herein as a method for determining the amount of $Csp^2$ or $Csp^3$ is a nuclear magnetic resonance (NMR) method, which exhibits one of the highest abilities to measure quantitative characteristics in determining the structure of a lot of kinds of organic and inorganic materials. The amount of $Csp^2$ or $Csp^3$ was measured using high-power decoupling with magic angle spinning (HD-MAS), which has a high quantitative-characteristic measurability in solid-state NMR. FIG. 1 shows an example of a $^{13}C$ NMR spectrum of an amorphous carbon film. As shown in FIG. 1, peaks attributed to $Csp^2$ and $Csp^3$ are observed around 130 ppm and 30 ppm, respectively. A ratio of $Csp^2$ content and a ratio of $Csp^3$ to the total amount of carbon were calculated from ratios of areas of portions surrounded by the respective peaks and a baseline.

The amount of $Csp^2$ of the amorphous carbon film of the present invention calculated as mentioned above is not less than 70 at. % and less than 100 at. % when the total amount of carbon is taken as 100 at. %. When the amount of $Csp^2$ is not less than 70 at. %, delocalization of π electrons is promoted and the amorphous carbon film exhibits high electric conductivity. However, when the amount of $Csp^2$ is 100 at. %, electric conductivity is obtained but amorphous carbon becomes powdery and a dense film cannot be obtained. It is preferred that the amount of $Csp^2$ of the amorphous carbon film of the present invention is not less than 75 at. %, not less than 80 at. %, not less than 85 at. %, and not less than 90 at. %, while it is not more than 99.5 at. % or not more than 99 at. %. It should be noted that carbon constituting the amorphous carbon film of the present invention is believed to be two kinds: $Csp^2$ and $Csp^3$. Therefore, the amount of $Csp^3$ of the amorphous carbon film of the present invention is not more than 30 at. % (excluding 0 at. %), when the total amount of carbon is taken as 100 at. %.

An amorphous carbon film having not less than 70 at. % of $Csp^2$ like the amorphous carbon film of the present invention can be formed by plasma CVD using, as a raw material, reaction gas containing at least one kind of gas selected from gas of a carbon cyclic compound containing $Csp^2$ and gas of a heterocyclic compound containing $Csp^2$ and nitrogen. When gas of a compound free from $Csp^2$ is used as a raw material, it is difficult to form an amorphous carbon film having not less than 70 at. % of $Csp^2$.

Hydrogen (H) content of the amorphous carbon film of the present invention is not more than 30 at. % (excluding 0 at. %). Since molecular termination by C—H bonds (σ bonds) is suppressed by reducing H content, π electrons increase and a high electric conductivity is exhibited. Therefore, as the amorphous carbon film of the present invention has a smaller H content, effect of improving electric conductivity is greater. Moreover, the C—H bonds also affect hydrophilicity of a surface of the amorphous carbon film. As the C—H bonds increase, hydrophilicity decreases and a contact angle θ (FIG. 3) expressed by an angle formed by a film surface and a tangent line of a liquid droplet increases. Therefore, it is preferred that the hydrogen content is not more than 25 at. %, not more than 20 at. %, not more than 18 at. %, not more than 15 at. % or not more than 13 at %. Electric conductivity and hydrophilicity increase with a decrease in H content, but if it has to be defined, a lower limit of H content can be not less than 3 at. %, not less than 5 at. %, or not less than 10 at. %.

N content of the amorphous carbon film of the present invention is not more than 20 at. % (excluding 0 at. %). Since a large N content promotes molecular termination due to formation of C≡N bonds, the N content is suppressed to not more than 20 at. %. It is preferred that the N content of the amorphous carbon film of the present invention is not less than 2 at. %, not less than 3 at. %, or not less than 4 at. %, while it is less than 20 at. %, not more than 18 at. %, not more than 15 at. %, or not more than 11 at. %.

Oxygen content of the amorphous carbon film of the present invention is not more than 3 at. % (excluding 0 at. %). Since excessive oxygen decreases electric conductivity, oxygen should not be positively introduced as a raw material in forming the amorphous carbon film. O contained in the amorphous carbon film is attributable to oxygen inevitably mixed during formation of the amorphous carbon film and inevitable oxidation of a surface of the amorphous carbon film. It is preferred that the O content is not more than 2.5 at. %, not more than 2 at. %, or not more than 1.5 at. %. Moreover, a lower limit of O content is not particularly limited, but if it has to be defined, it is preferred that the O content is not less than 0.3 at. % or not less than 0.5 at. %.

The amorphous carbon film of the present invention may contain any other additive element as long as it does not exert an adverse impact on electric conductivity or hydrophilicity. Examples of such additives include silicon (Si), boron (B), and titanium (Ti) for improving adhesion between the amorphous carbon film and a substrate. It is preferred that content of these additive elements is suppressed to not more than 5 at. %, not more than 3 at. %, or not more than 1 at. %.

In the amorphous carbon film of the present invention, when detected from its surface layer by XPS, O content ratio is not less than 4 at. % and not more than 15 at. %, and N content ratio is not less than 10 at. % and not more than 30 at. %. That is to say, the O content and the N content defined herein are O content ratio and N content ratio only in the surface layer of the amorphous carbon film which can be measured by XPS and values when the surface layer (excluding H) is taken as 100 at. %.

In the amorphous carbon film of the present invention, O and N are concentrated on a surface side of the film. That is to say, O content ratio and N content ratio in the surface layer obtained by XPS are higher than O content ratio and N content ratio in the entire amorphous carbon film.

O is an element which enhances hydrophilicity of a surface of an amorphous carbon film, but also an element which increases contact resistance. By setting O content ratio to not less than 4 at. %, good hydrophilicity (for example, a contact angle θ of not more than 20°) is exhibited. However, in view of a reduction in contact resistance, the O content is suppressed to not more than 15 at. %. If the O content exceeds 15 at. %, sufficient contact resistance is hardly obtained irrespective of an increase in N content in the surface layer. Preferred O content ratio is not less than 4.5 at. % or not less than 5 at. % while it is not more than 13 at. % or not more than 11 at. %.

N has some relation to electric conductivity of the amorphous carbon film and particularly compensates for contact resistance increased by oxidation of the film surface. Therefore, N content is set to not less than 10 at. %, and preferably to not less than 11 at. %, or not less than 12 at. % and more preferably to not less than 13 at. %. However, since excessive N content ratio promotes molecular termination due to formation of C≡N bonds, the N content is suppressed to not more than 30 at. %. Preferred N content ratio is not more than 25 at. %, less than 20 at. %, not more than 19 at. %, or not more than 18 at. %.

The present invention is an amorphous carbon film containing carbon as a main component. This can be confirmed by pulverizing the amorphous carbon film of the present invention into powder and performing X-ray diffraction (XRD) measurement on the powder. According to XRD measurements, sharp diffraction peaks indicating presence of crystal are not detected, and a diffraction peak corresponding to (002) planes of graphite shows a broad halo pattern.

In this case, it is preferred that mean interplanar distance between (002) planes calculated from Bragg's Law is 0.34 to 0.50 nm. When the mean interplanar distance between (002) planes is not more than 0.50 nm, owing to a small interplanar distance, it electron interaction between the planes increases and electric conductivity improves. It should be noted that mean interplanar distance between (002) planes of graphite is 0.34 nm.

Upon having composition of the entire film and the surface layer in the aforementioned ranges, the amorphous carbon film of the present invention exhibits a high electric conductivity. Electric conductivity of the amorphous carbon film of the present invention is not particularly limited, but it is preferred that volume resistivity is not more than $10^2 \Omega cm$ or not more than $10^1 \Omega cm$. Moreover, it is preferred that contact resistance is not more than 10 $m\Omega cm^2$ or not more than 8 $m\Omega cm^2$.

Furthermore, if hydrophilicity of the amorphous carbon film of the present invention is to be defined, it is preferred that a contact angle θ is not more than 20°, not more than 18° or not more than 16°. With a contact angle of not more than 20°, hydrophilicity is high and drainage is good.

<Process for Forming Amorphous Carbon Film>

The amorphous carbon film of the present invention can be formed by already known CVD or PVD methods such as plasma CVD, ion plating, and sputtering. However, PVD methods such as sputtering form films with directivity. Hence, in order to form a uniform film, it is necessary to place a plurality of targets in a device or rotate a substrate on which a film is to be formed. As a result, the film-forming device is complicated in structure and expensive. Besides, a film is difficult to be formed depending on shape of a substrate. On the other hand, plasma CVD, which forms films by reaction gas, can form uniform films irrespective of shape of the substrate. Moreover, a film forming device is simple in structure and inexpensive.

When the amorphous carbon film of the present invention is formed by plasma CVD, first a substrate is placed in a vacuum vessel and reaction gas and a carrier gas are introduced. Next, plasma is generated by an electric discharge so as to deposit a material on the substrate. However, in order to form an amorphous carbon film having a high ratio of $Csp^2$ in the entire carbon and having a small hydrogen content like the amorphous carbon film of the present invention, it is necessary to select and use such reaction gas as mentioned in detail later.

Examples of plasma CVD include high frequency plasma CVD using high frequency discharge, microwave plasma CVD using microwave discharge, and direct current plasma CVD using direct current discharge. Above all, direct current plasma CVD is preferred. According to direct current plasma CVD, a film forming device can be constituted by a vacuum furnace and a DC power source and films can be formed with ease on substrates having a variety of shapes.

Hereinafter, a process for forming the amorphous carbon film according to the present invention will be described as a preferred embodiment using plasma CVD. The process for forming the amorphous carbon film according to the present invention forms the amorphous carbon film of the present invention on a surface of a substrate by introducing reaction gas comprising nitrogen gas and carbon containing gas containing at least one kind of gas selected from gas of a carbon cyclic compound containing $Csp^2$ and gas of a nitrogen-containing heterocyclic compound containing $Csp^2$ and N into a reaction vessel containing the substrate, and generating plasma. Especially, the amorphous carbon film of the present invention is formed by way of a first film forming step, and a second film forming step after the first film forming step, and the second film forming step is carried out by introducing the reaction gas into the reaction vessel in such a manner that a flow ratio of the nitrogen gas to the carbon-containing gas is greater than the flow ratio in the first film forming step. It should be noted that this process can be grasped as a process for producing the electrically conductive member or the fuel cell bipolar plate of the present invention, which will be mentioned later.

As the substrate, it is possible to use a material selected from metal, semiconductor, ceramic, resin and so on. Examples of the substrate include a substrate formed of metal such as iron or iron-based alloys such as carbon steel, alloy steel and cast iron, aluminum or aluminum alloys, titanium or titanium alloys, and copper or copper alloys; a substrate formed of semimetal such as silicon; a substrate formed of ceramic such as super-steel, silica, alumina and silicon carbide; and a substrate formed of resin such as polyimide, polyamide and polyethylene terephthalate. When a substrate has a low electric conductivity, it is preferred to apply a pretreatment to impart electric conductivity before forming the amorphous carbon film.

Moreover, from a viewpoint of improving adhesion between the substrate and the amorphous carbon film, it is preferred to apply treatment to form concavities and convexities by ion bombardment to a surface of the substrate beforehand. Specifically, first, a substrate is placed in a vessel, and gases in the reaction vessel are evacuated to a predetermined gas pressure. Next, a noble gas for forming concavities and convexities is introduced into the reaction vessel. Next, ion bombardment is carried out by glow discharge or ion beam, thereby forming concavities and convexities on the surface of the substrate. Moreover, in order to form uniform and fine concavities and convexities on the surface of the substrate, it is preferred to apply nitriding treatment before applying the treatment to form the concavities and convexities. Examples of the method for nitriding treatment include gas nitriding, salt bath nitriding and ion nitriding.

The reaction gas includes nitrogen gas and carbon-containing gas. The carbon containing gas contains at least one kind of gas selected from gas of a carbon cyclic compound containing $Csp^2$, and gas of a nitrogen-containing heterocyclic compound containing $Csp^2$ and N. Herein, the "carbon cyclic compound" is a cyclic compound in which all atoms constituting a ring are carbon atoms. In contrast, the "heterocyclic compound" is a cyclic compound in which a ring is constituted by two or more kinds of atoms. Examples of the carbon cyclic compound containing $Csp^2$, in other words, a carbon cyclic compound having a carbon-carbon double bond include aromatic hydrocarbon compounds such as benzene, toluene, xylene, and naphthalene; N-containing aromatic compounds such as aniline and azobenzene; and cyclohexene. Examples of the nitrogen-containing heterocyclic compound containing $Csp^2$ and N include pyridine, pyrazine, pyrrole, imidazole and pyrazole, in which a ring is constituted by carbon and nitrogen. The carbon containing gas can be at least one kind of gas selected from these gases. Among these gases, the nitrogen-containing heterocyclic gas, especially pyridine is preferred as the carbon-containing gas in view of stability as a raw material and capability of stable plasma discharge.

Moreover, the reaction gas can contain one or more gases other than the aforementioned. For example, when a silicon-containing amorphous carbon film is to be formed, it is possible to employ not only gas of a Si-containing aromatic compound such as phenylsilane and phenylmethylsilane, but also gas of a silicon compound such as $Si(CH_3)_4$ [TMS], $Si(CH_3)_3H$, $Si(CH_3)_2H_2$, $Si(CH_3)H_3$, $SiH_4$, $SiCl_4$, and $SiH_2F_4$. It is also possible to employ gas of a nitrogen compound such as ammonia, methylamine, dimethylamine, and trimethylamine. Some of these compound gases do not contain carbon, but in calculation of a gas flow ratio mentioned later, these gases can be included in constituents of the carbon-containing gas together with the aforementioned essential cyclic compound gas.

Flow rate of the reaction gas introduced into the reaction vessel is not particularly limited, but when the flow rate is expressed in sccm, which stands for standard cc/min, indicating volume per minute at standard temperature and pressure (0 deg. C., 1 atmospheric pressure) per unit surface area ($m^2$) of a surface to be treated, the flow rate is desirably not less than 100 sccm/$m^2$, and more desirably not less than 250 sccm/$m^2$ or not less than 500 sccm/$m^2$. This is because the process for forming the amorphous carbon film according to the present invention exhibits an oxidation suppression effect especially to a surface of an amorphous carbon film rapidly formed by introducing the reaction gas at a high flow rate. It should be noted that the surface to be treated includes not only surface area of the substrate but also surface area of a fixture which constitutes a cathode together with the substrate and on which the amorphous carbon film is positively formed. A ratio of nitrogen gas to the carbon-containing gas in the reaction gas will be discussed later.

Besides, a carrier gas can be introduced together with the reaction gas. When the carrier gas is used, a film-forming atmosphere in the reaction vessel is constituted by the reaction gas and the carrier gas. Hydrogen and/or argon gas or the like can be used as the carrier gas. If flow rate of the carrier gas is to be defined, the flow rate is desirably 1 to 1000 sccm/$m^2$ or 5 to 500 sccm/$m^2$ or more. Moreover, if a ratio of the reaction gas flow rate to the carrier gas flow rate is to be defined, it is desired that (the reaction gas flow rate):(the carrier gas flow rate) is 1:0.1 to 1:100 or 1:0.5 to 1:50.

Pressure in the reaction vessel can be set to not less than 1 Pa and not more than 1300 Pa. It is preferred that the pressure is not less than 3 Pa and not more than 800 Pa, or not less than 5 Pa and not more than 100 Pa. With an increase in film forming pressure, the reaction gas has a higher concentration and a film forming rate increases.

Although voltage in electric discharge is not particularly limited, it is desired that the voltage is not less than 1000 V, not less than 1500 V, or not less than 2000 V. With a high voltage of not less than 1000 V, the reaction gas decomposes easily and hydrogen content of the amorphous carbon film decreases even if film-forming temperature is about 300 to 600 deg. C. Moreover, an amorphous carbon film formed under these conditions is hard and dense and has few defects. However, if film-forming temperature is as high as not less than 500 deg. C., the reaction gas decomposes easily irrespective of a voltage of less than 1000 V. The film forming temperature herein is temperature of a substrate surface during film formation.

It should be noted that the aforementioned ranges of the reaction gas flow rate, the carrier gas flow rate, the pressure, the film-forming temperature, the voltage and so on are commonly suitable to the first film forming step and the second film forming step, which will be mentioned next. In examples, these conditions except a gas flow ratio mentioned later were set to be the same between the first film forming step and the second film forming step, but can be different between these two steps.

In the process for forming the amorphous carbon film according to the present invention, the amorphous carbon film is formed by way of the first film forming step and the second film forming step after the first film forming step as mentioned before. The second film forming step is carried out by introducing the reaction gas into the reaction vessel in such a manner that a flow ratio of the nitrogen gas to the carbon-containing gas is greater than the flow ratio in the first film forming step.

A ratio of the nitrogen gas flow rate to the carbon-containing gas flow rate (the nitrogen gas flow rate/the carbon-containing gas flow rate=Fr) in each of the first film forming step and the second film forming step is not particularly limited. It is only necessary that a flow ratio $Fr^1$ in the first film forming step and a flow ratio $Fr^2$ in the second film forming step satisfy a relation, $Fr^1 < Fr^2$. If it has to be defined, it is desired that the flow ratio $Fr^1$ in the first film forming step is not less than 0.1 and not more than 50, not less than 0.5 and not more than 10, or not less than 0.8 to not more than 2. In view of setting N content of the surface layer in a predetermined range, the flow ratio $Fr^2$ in the second film forming step is desirably not less than 10, and more desirably not less than 25. An upper limit of $Fr^2$ is not particularly limited, and the second film forming step can be carried out by using only nitrogen gas. However, in order to increase rate of forming the surface layer, $Fr^2$ is desirably not more than 1000 or not more than 500, and more desirably not more than 200.

The flow ratio needs to be changed from $Fr^1$ to $Fr^2$ in proceeding from the first film forming step to the second film forming step. It is preferred to start an electric discharge by using the flow ratio $Fr^1$ and stop the discharge after a predetermined period of time to end the first film forming step, and then introduce the reaction gas and the like into the reaction vessel at the flow ratio $Fr^2$ and apply voltage again to perform the second film forming step. It is also possible to decrease flow rate of the carbon-containing gas immediately and start the second film forming step while continuing the electric discharge from the first film forming step.

Film formation time of the first film forming step and the second film forming step can be appropriately selected in accordance with thickness of the amorphous carbon film. The film formation time can be appropriately adjusted in order that composition of the entire amorphous carbon film and composition of the surface layer measured by XPS fall in the aforementioned ranges. For example, when film formation time of the first film forming step is $T^1$ and film formation time of the second film forming step is $T^2$, it is desired that $T^2/(T^1+T^2)$ is in a range of 0.01 to 0.95 or 0.05 to 0.5. Since thickness of the surface layer of the amorphous carbon film formed in the second film forming step is not particularly limited, thickness of the surface layer measured by XPS is not always identical with thickness of the surface layer formed in the second film formation layer. If it has to be defined, thickness of the surface layer formed in the second film forming step is preferably 1 to 5 nm or 2 to 3 nm.

Electrically Conductive Member Having Amorphous Carbon Film

An electrically conductive member of the present invention comprises a substrate and the aforementioned amorphous carbon film formed on at least part of the substrate.

Description of the substrate has already been given in the section of <Process for Forming Amorphous Carbon Film>. Upon formed on a surface of an electrically non-conductive substrate, an amorphous carbon film can impart high electric conductivity to a portion where the amorphous carbon film is formed. Alternatively, upon formed on a surface of an electrically conductive substrate, an amorphous carbon film can impart corrosion resistance, wear resistance, solid lubricating properties and the like to the substrate without lowering electric conductivity of the substrate. For example, taking advantage of electric conductivity and corrosion resistance of the amorphous carbon film, the conductive member of the present invention can be used as a fuel cell bipolar plate, which will be mentioned in detail later, a variety of kinds of electrode materials of secondary batteries and so on.

Fuel Cell Bipolar Plate

A fuel cell bipolar plate of the present invention comprises a metal substrate and an amorphous carbon film covering at least part of a surface of the substrate to face an electrode. In general, a fuel cell bipolar plate has a surface part of which contacts an electrode deposited on solid electrolyte and forms gas passages by dividing space between the bipolar plate and the electrode. Upon covering a surface of the metal substrate with the aforementioned amorphous carbon film of the present invention, the metal substrate exhibits necessary electric conductivity and drainage for a fuel cell bipolar plate.

The fuel cell bipolar plate of the present invention is applicable to a general fuel cell. The general fuel cell has one or more single cells each constituted by solid electrolyte and a pair of electrodes sandwiching the solid electrolyte from both sides. Each of the electrodes comprises a catalytic layer containing metal catalyst-loaded carbon powder as a main component and formed on a surface of a polymer electrolyte membrane, and a gas diffusion layer located on an outer surface side of the catalyst layer and having permeability and electric conductivity. The carbon powder constituting the catalyst layer is loaded with a catalyst such as platinum, nickel and palladium. Generally used as the gas diffusion layer are carbon fiber woven cloth (carbon cloth) and carbon fiber non-woven cloth (carbon paper).

It is preferred that the substrate of the bipolar plate is formed of an electrically conductive metal material having low electric resistance (about $10^{-3}$ Ωcm or less in terms of volume resistivity). It is also preferred that the substrate is formed of a metal material having high corrosion resistance. It is also preferred that the substrate is formed of a material having poor gas permeability. Specific examples of such a metal material include pure titanium and titanium alloys, aluminum and aluminum alloys, copper and copper alloys, stainless steel, high-speed steel, and nickel alloys. Shape of the substrate can be appropriately selected in accordance with specifications of a fuel cell.

The aforementioned amorphous carbon film of the present invention can be used as the amorphous carbon film covering the substrate. By doing so, a bipolar plate having both good electric conductivity and good drainage is formed.

Furthermore, thickness of the amorphous carbon film is not particularly limited, but with an increase in film thickness, a higher corrosion resistance which amorphous carbon inherently has is exhibited. Therefore, it is preferred that the thickness of the amorphous carbon film is not less than 1 nm or not less than 10 nm. However, since the amorphous carbon film is hard, risk of peeling off or cracking is higher with an increase in film thickness. Therefore, it is preferred that the film thickness is not more than 20 μm or not more than 10 μm.

Although the embodiments of the amorphous carbon film, the process for forming the amorphous carbon film, the electrically conductive film and the fuel cell bipolar plate having the amorphous carbon film according to the present invention have been described heretofore, the present invention is not limited to the aforementioned embodiments. For example, embodiments of the amorphous carbon film in the fuel cell bipolar plate of the present invention, which portion of the substrate should be covered with the film, and shape of the bipolar plate can be appropriately selected.

EXAMPLES

Electrically conductive members were produced by forming a variety of amorphous carbon films on surfaces of substrates according to the aforementioned embodiments. First, a direct current plasma CVD film-forming device (abbreviated as the "PCVD film-forming device") used in the production of the electrically conductive members and procedure for forming an amorphous carbon film will be described with reference to FIG. 2.

PCVD Film-Forming Device and Procedure for Forming Amorphous Carbon Film

Figure 2:
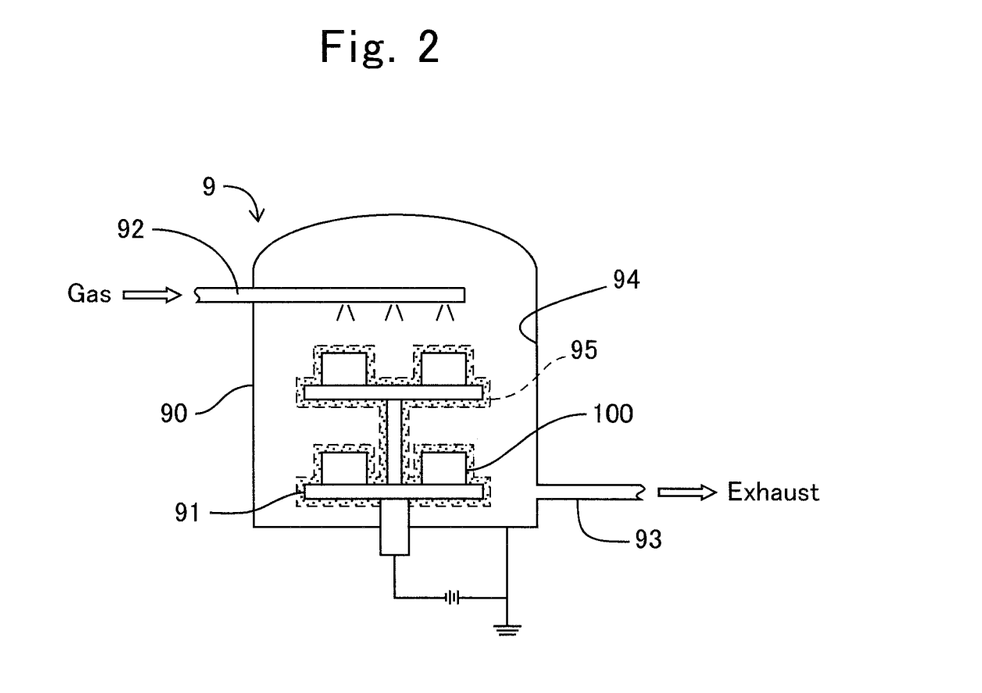
FIG. 2 is a schematic diagram of a direct current plasma CVD film forming device.

As shown in FIG. 2, a PCVD film-forming device 9 comprises a stainless steel chamber 90, a pedestal 91, a gas inlet pipe 92, and a gas outlet pipe 93. The gas inlet pipe 92 is connected to various kinds of gas cylinders (not shown) by way of valves (not shown). The gas outlet pipe 93 is connected to a rotary pump (not shown) and a diffusion pump (not shown) by way of valves (not shown).

A substrate 100 is placed on the pedestal 91 installed in the chamber 90. After the substrate 100 is placed, the chamber 90 is sealed and gases in the chamber 90 are evacuated by the rotary pump and the diffusion pump connected to the gas outlet pipe 93.

In forming an amorphous carbon film on the substrate 100, first, hydrogen gas and argon gas are introduced into the chamber 90 from the gas inlet pipe 92. In the following examples, hydrogen gas was introduced at 200 sccm/m² and argon gas was introduced at 200 sccm/m² and gas pressure was set to 11 Pa. Then, when a DC voltage is applied between a stainless steel anode plate 94 and the pedestal 91 both provided in the chamber 90, an electric discharge starts. In the following examples, a DC voltage of 3000 V was applied and temperature of the substrate 100 was increased to a predetermined film-forming temperature by ion bombardment.

In the film forming step for forming an amorphous carbon film, nitrogen ($N_2$) gas and pyridine gas were introduced as reaction gas at predetermined flow rates from the gas inlet pipe 92 in addition to the hydrogen gas and the argon gas at the aforementioned flow rates, and the gas pressure was set to 11 Pa. After that, electric power of 3000 V (electric current: 1 A) was applied between the stainless steel anode plate 94 and the pedestal 91 provided in the chamber 90, an electric discharge 95 started and an amorphous carbon film started being formed on a surface of the substrate 100.

It should be noted that the gas flow rate of each of the carrier gas and the reaction gas is gas flow rate (sccm) per $m^2$ of a surface to be covered with a film. Area of the surface to be covered is a total of surface area of the substrate and surface area of the pedestal 100.

Production of Electrically Conductive Member

Amorphous carbon films having different kinds of composition were formed each of which was deposited on a substrate (a pure titanium plate of 100 mm×250 mm×0.1 mm in thickness) by one film-forming procedure, thereby producing electrically conductive members #01 to #04 and #C1 to #C3. It should be noted that in the production of the electrically conductive members #01 to #04, a series of film forming steps for forming the amorphous carbon films were carried out in two steps (Step 1 and Step 2) by changing only flow ratio of nitrogen gas to pyridine gas. Step 1 and Step 2 will be described below.

(Step 1) Reaction gas shown in Table 1 was introduced into the chamber 90 at a predetermined gas flow rate shown in Table 1 while adjusting flow ratio of nitrogen gas to pyridine gas ($N_2$ gas flow rate/pyridine gas flow rate) to a predetermined gas flow ratio shown in Table 1. Then, an electric discharge was started by applying electric power between the stainless steel anode plate 94 and the pedestal 91.

(Step 2) After a certain period of time passed from the start of the electric discharge in Step 1, the application of the electric power was once stopped. Next, reaction gas was introduced into the chamber 90 at a predetermined gas flow rate shown in Table 1 while adjusting $N_2$ gas flow rate/ pyridine gas flow rate to a predetermined gas flow ratio shown in Table 1. Then, an electric discharge was started by applying electric power between the stainless steel anode plate 94 and the pedestal 91. Film formation time of Step 2 was controlled so that a surface portion formed in Step 2 would have a thickness of 2 to 3 nm.

film of each of the obtained electrically conductive members by film forming time. Film thickness was obtained by observing a cross section of each of the electrically conductive members by a scanning electron microscope (SEM), measuring thickness of a plurality of portions of each of the films and using an average of these measured values. Film formation time is total time required for film formation in the film forming steps (Step 1 and Step 2 when film formation was carried out in two steps).

Evaluation

Electric conductivity and hydrophilicity in association with composition were evaluated by measuring composition, contact resistance and contact angle of the amorphous carbon films by the following procedure.

Composition Analysis

Measurement results of composition of the amorphous carbon films of the respective electrically conductive members are shown in Table 2. C and N content of each entire amorphous carbon film was determined by electron probe micro-analysis (EPMA), X-ray photoelectron spectroscopy (XPS), Auger electron spectroscopy (AES), and Rutherford backscattering spectroscopy (RBS). H content of each of the entire amorphous carbon films was measured by elastic recoil detection analysis (ERDA). ERDA is a method for measuring hydrogen concentration in a film by radiating a helium ion beam of 2 MeV on a surface of the film and detecting hydrogen expelled from the film by a semiconductor detector. The amount of $Csp^2$ and the amount of $Csp^3$ were determined by an NMR spectrum described in detail before.

Moreover, composition of a surface layer of each of the amorphous carbon films was analyzed by using an XPS instrument "Quantera SXM" produced by Ulvac-Phi, Inc. under the following conditions.

Measured under these conditions was composition of the surface layer within a depth of 2 nm from an outermost surface.

X-ray Source: monochromatic Al Kα
Photoelectron Emission Angle: 45°
Analysis Area: about 200 µm in diameter
Pass Energy: 26 eV
Energy Step: 0.1 eV

TABLE 1

| ELECTRICALLY CONDUCTIVE MEMBER NO. | REACTION GAS | | | FILM FORMATION TEMPERATURE ° C. | FILM FORMING RATE nm/min |
|---|---|---|---|---|---|
| | GAS FLOW RATE sccm/$m^2$ | $N_2$ GAS/PYRIDINE GAS | | | |
| | | STEP 1 | STEP 2 | | |
| #C1 | 50 | 8 | | 400 | 15 |
| #C2 | 500 | 1.7 | | 400 | 150 |
| #C3 | 500 | 1.7 | | 560 | 200 |
| #01 | 500 | 1.7 | 30 | 560 | 220 |
| #02 | 500 | 1.7 | 50 | 560 | 220 |
| #03 | 1000 | 1.7 | 100 | 570 | 280 |
| #04 | 1000 | 1 | 100 | 570 | 350 |

"Film-forming temperature" in Table 1 is temperature of the electric members measured using a radiation thermometer when film formation finished, but equivalent to surface temperature of the electric members during film formation. Moreover, "film forming rate" was calculated by dividing an actual measured thickness value of the amorphous carbon It should be noted that H is not detected by XPS, but since almost no elements other than C, N and O were present, content percent of each element was obtained in terms of percent of the number of atoms of each element (at. %) when the total amount of C, N and O is taken as 100. Measurement results are shown in Table 2.

Measurement of Contact Angle

Figure 3:
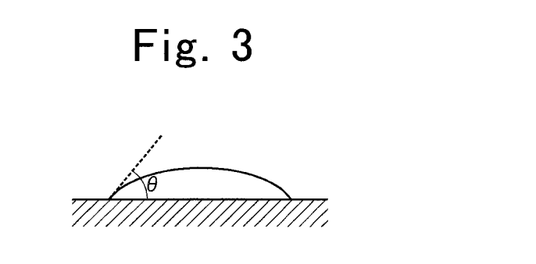
FIG. 3 is an explanatory view illustrating a contact angle, which is an index of wettability.

Contact angle of the amorphous carbon films formed on the respective electrically conductive members was measured as an index of wettability. A contact angle θ is shown in FIG. 3. Measurement of contact angle was performed by adding a dynamic element by allowing liquid droplets to fall from a predetermined height onto a film surface in order to simulate water drainage from a gas diffusion layer in a fuel cell. Specifically, water droplets were dropped vertically down on a horizontal film surface of each of the amorphous carbon films. Drop distance was set to 35 mm and droplet volume was set to 2 μL. A contact angle θ (See FIG. 3) was measured one second after dropping a droplet by a contact angle gauge (Dropmaster 700 produced by Kyowa Interface Science Co., Ltd.). Results are shown in Table 2.

Measurement of Contact Resistance

Contact resistance was measured between the respective electrically conductive members and carbon paper, which will constitute a gas diffusion layer in a fuel cell bipolar plate.

Figure 4:
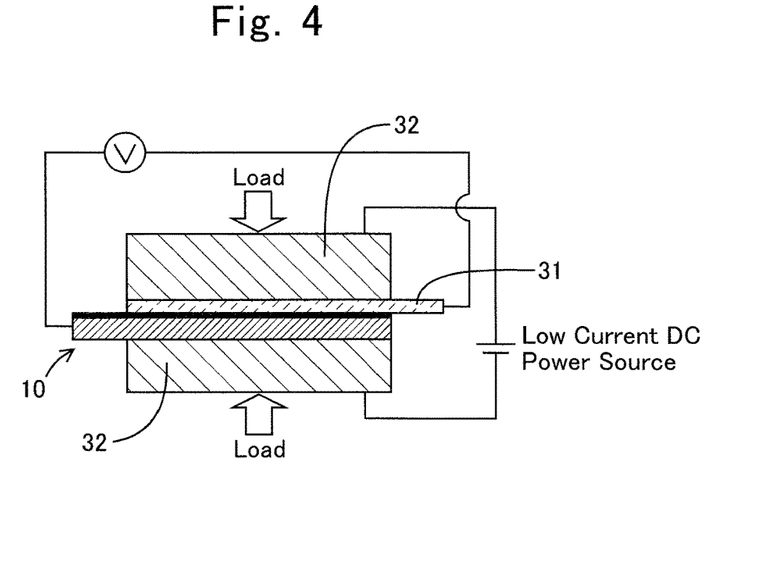
FIG. 4 is a cross-sectional view schematically showing construction of a device for measuring contact resistance between an electrically conductive member and carbon paper.

As shown in FIG. 4, contact resistance was measured by placing carbon paper 31 on an amorphous carbon film of an electrically conductive member 10 and sandwiching the carbon paper 31 and the electrically conductive member 10 with a pair of copper plates 32. Contact surfaces of the copper plates 32 to contact the electrically conductive member 10 and the carbon paper 31 had gold plating. In this case, contact surfaces of the amorphous carbon film of the electrically conductive member 10 and the carbon paper 31 had an area of 2 cm×2 cm. A load of 1.47 MPa was applied perpendicularly to the contact surfaces of the two copper plates 32 by a load cell. Under these conditions, a direct current of 1 A was applied between the two copper plates 32 by a low current DC power source. An electric resistance was calculated from a value obtained by measuring a difference in potential between the electrically conductive member 10 and the carbon paper 31 at 60 seconds after the start of the load application and used as a contact resistance value. Measurement results are shown in Table 2.

C1 was an electrically conductive member obtained by forming an amorphous carbon film at a small gas flow rate (50 sccm/m$^2$) without changing the gas flow ratio. Since its surface layer contained 2 at. % of O, there was little oxidation of the surface layer. Therefore, contact resistance was very small, but a contact angle θ was very large and hydrophilicity was not sufficient. It should be noted that the reason why O content of the entire amorphous carbon film composition of #C1 is "0" is that O content ratio in the film as a whole was very close to zero.

C2 and #C3 were electrically conductive members produced by increasing gas flow rate under the production conditions of #C1. O content of each of the entire amorphous carbon film compositions was not more than 4 at. %, but O content ratio of a surface layer of each of the amorphous carbon films was very high. This is assumed to be because a large volume of reaction gas present in the chamber was not sufficiently decomposed, and as a result film formation finished with a film surface active and the film was easily oxidized in the air. As a result, contact resistance was very high. It is believed that large contact angle θ regardless of high O content ratio of the surface layer was caused by C—H bonds (deriving from an undecomposed organic group) on the surface. XPS cannot detect H on the surface layer, but in consideration of large H content in entire amorphous carbon film composition, a larger amount of C—H bonds are present in the surface layers of #C2 and #C3 than in the surface layer of #C1. It is believed that these C—H bonds lowered hydrophilicity of the surface. Furthermore, since #C3 was formed at a higher temperature than #C2, #C3 had a lower H content than #C2.

01 and #02 were electrically conductive members produced by performing the film forming steps in two steps under the production conditions of #C3. O content ratio in the surface layer decreased from 16 at. % to not more than 10 at. % by performing Step 2. This is estimated to be because oxidation of film surface in the air was suppressed by forming a surface layer having a high N content on an amorphous carbon film #01 or #02. The surface layers of #01 and #02 had higher O content than that of #C1. Therefore, contact resistance and contact angle θ of #01 and #02 had

TABLE 2

| ELECTRICALLY CONDUCTIVE MEMBER NO. | ENTIRE FILM COMPOSITION (at. %) | | | | RATIO in CARBON | | FILM SURFACE LAYER COMPOSITION (at. %) | | | CONTACT RESISTANCE | DYNAMIC CONTACT |
|---|---|---|---|---|---|---|---|---|---|---|---|
| | C | N | H | O | Csp$^2$ | Csp$^3$ | C | N | O | mΩ cm$^2$ | ANGLE ° |
| #C1 | 80 | 6 | 14 | 0 | 99 | 1 | 89 | 9 | 2 | 3 | 63 |
| #C2 | 72 | 6 | 18 | 4 | 90 | 10 | 74 | 8 | 18 | 60 | 45 |
| #C3 | 74 | 8 | 14 | 4 | 95 | 5 | 73 | 9 | 16 | 25 | 38 |
| #01 | 78 | 10 | 11 | 1 | 96 | 4 | 78 | 12 | 10 | 6 | 13 |
| #02 | 78 | 10 | 11 | 1 | 96 | 4 | 82 | 13 | 5 | 5 | 15 |
| #03 | 78 | 8 | 13 | 1 | 93 | 7 | 76 | 17 | 7 | 5 | 15 |
| #04 | 79 | 5 | 14 | 2 | 91 | 9 | 80 | 12 | 8 | 7 | 18 |

C1 to #C3 were electrically conductive members produced without changing flow ratio of nitrogen gas to pyridine gas. #01 to #04 were those produced by changing flow ratio of nitrogen gas to pyridine gas between Step 1 and Step 2. It was estimated from entire amorphous carbon film composition that all the electrically conductive members had low volume resistivity and good electric conductivity.

enough good values to serve as bipolar plates. Small contact resistance regardless of 5 to 10 at. % of oxygen content in the surface layer was obtained owing to presence of a sufficient amount of N.

03 and #04 were electrically conductive members produced by further increasing flow rate of the reaction gas. Although the gas flow rate in forming a film was 100.0 sccm/m$^2$, oxidation of film surface was suppressed by a surface portion of each amorphous carbon film formed in Step 2. As a result, #03 and #04 attained both low contact resistance and hydrophilicity.

Moreover, it has been found out from the contact angle θ of the respective electrically conductive members shown in Table 1 that if a surface of an amorphous carbon film is terminated with oxygen, hydrophilicity of the surface has a tendency to increase (i.e., θ has a tendency to be small). However, when the amorphous carbon film had a large amount of hydrogen, hydrophilicity was lowered (θ became greater). Taking an effect of C—H bonds on hydrophilicity, it has been noticed that hydrophilicity of a surface of an amorphous carbon film can be secured by limiting H content in the entire amorphous carbon film to not more than 15 at. % or not more than 13 at. %.

It has also been discovered that in order to suppress oxidation of a surface of an amorphous carbon film after formed, it is optimal also in view of a decrease in contact resistance to set N content ratio in the surface layer to not less than 10 at. %.

That is to say, it has been found out that upon setting N content ratio and O content ratio in a surface layer of an amorphous carbon film in optimal ranges, suitable contact resistance and wettability to a fuel cell bipolar plate are imparted to a surface of the amorphous carbon film.

The invention claimed is:

1. An amorphous carbon film containing carbon as a main component, not more than 30 at. % of hydrogen, not more than 20 at. % of nitrogen and not more than 3 at. % of oxygen (all excluding 0 at. %), and when the total amount of the carbon is taken as 100 at. %, the amount of carbon having an $sp^2$ hybrid orbital being not less than 70 at. % and less than 100 at. %, which is characterized in that nitrogen and oxygen are concentrated on a surface side of the film and when detected from a surface layer within a depth of 2 nm from an outermost surface by X-ray photoelectron spectroscopy, oxygen content ratio is not less than 4 at. % and not more than 15 at. % and nitrogen content ratio is not less than 10 at. % and not more than 30 at. % when the total of the carbon, nitrogen and oxygen of the film surface layer composition is taken as 100 at. %.

2. The amorphous carbon film according to claim 1, having a dynamic contact angle of not more than 20°.

3. The amorphous carbon film according to claim 1, wherein nitrogen content ratio detected from the surface layer is not less than 10 at. % and not more than 20 at. %.

4. The amorphous carbon film according to claim 1, containing not less than 0.5 at. % of oxygen.

5. The amorphous carbon film according to claim 1, containing not more than 15 at. % of hydrogen.

6. A process for forming the amorphous carbon film according to claim 1 on a surface of a substrate by plasma CVD by introducing reaction gas comprising nitrogen gas and carbon-containing gas including at least one kind of gas selected from gas of a carbon cyclic compound containing carbon having an $sp^2$ hybrid orbital and gas of a nitrogen-containing heterocyclic compound containing carbon having an $sp^2$ hybrid orbital and N into a reaction vessel containing the substrate, and generating plasma, which is characterized in that:

the amorphous carbon film is formed by way of a first film forming step, and a second film forming step after the first film forming step, and the second film forming step is carried out by introducing the reaction gas into the reaction vessel in such a manner that a flow ratio of the nitrogen gas to the carbon-containing gas is greater than the flow ratio in the first film forming step.

7. The process for forming the amorphous carbon film according to claim 6, wherein the gas flow ratio in the second film forming step is not less than 10.

8. The process for forming the amorphous carbon film according to claim 7, wherein the gas flow ratio in the second film forming step is not less than 10 and not more than 1000.

9. The process for forming the amorphous carbon film according to claim 6, wherein flow rate of the reaction gas introduced into the reaction vessel is not less than 100 sccm per $m^2$ of surface area of a surface to be treated.

10. The process for forming the amorphous carbon film according to claim 6, wherein the carbon-containing gas includes the gas of the nitrogen-containing heterocyclic compound.

11. The process for forming the amorphous carbon film according to claim 10, wherein the nitrogen-containing heterocyclic compound is at least one selected from pyridine, pyridine and pyrrole.

12. An electrically conductive member having an amorphous carbon film, which is characterized in comprising a substrate and the amorphous carbon film according to claim 1 formed on at least part of the substrate.

13. A fuel cell bipolar plate, comprising a metal substrate and an amorphous carbon film covering at least part of a surface of the substrate to face an electrode, which is characterized in that the amorphous carbon film is the amorphous carbon film claim 1.

14. The amorphous carbon film according to claim 1, when detected from a surface layer by X-ray photoelectron spectroscopy, the oxygen content ratio is not less than 4 at. % and not more than 11 at. % and the nitrogen content ratio is not less than 12 at. % and not more than 30 at. % when the total of the carbon, nitrogen and oxygen of the film surface layer composition is taken as 100 at. %.

15. The amorphous carbon film according to claim 1, when detected from a surface layer by X-ray photoelectron spectroscopy, the oxygen content ratio is not less than 5 at. % and not more than 10 at. % and the nitrogen content ratio is not less than 12 at. % and not more than 17 at. % when the total of the carbon, nitrogen and oxygen of the film surface layer composition is taken as 100 at. %.

* * * * *